(12) United States Patent  
Okamoto et al.

(10) Patent No.: US 12,533,715 B2
(45) Date of Patent: Jan. 27, 2026

(54) SUBSTRATE CLEANING APPARATUS AND SUBSTRATE CLEANING METHOD

(71) Applicant: Tokyo Electron Limited, Tokyo (JP)

(72) Inventors: Yoshiki Okamoto, Koshi (JP); Akihiro Kubo, Koshi (JP); Yasushi Takiguchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 29 days.

(21) Appl. No.: 18/322,855

(22) Filed: May 24, 2023

(65) Prior Publication Data

US 2023/0381825 A1  Nov. 30, 2023

(30) Foreign Application Priority Data

May 26, 2022 (JP) ................. 2022-086344

(51) Int. Cl.
*B08B 3/02* (2006.01)
*B08B 1/14* (2024.01)
*B08B 1/20* (2024.01)
*H01L 21/67* (2006.01)

(52) U.S. Cl.
CPC ............ *B08B 3/022* (2013.01); *B08B 1/14* (2024.01); *B08B 1/20* (2024.01); *H01L 21/67051* (2013.01)

(58) Field of Classification Search
CPC .. B08B 1/10; B08B 1/20; B08B 3/022; B08B 1/14; B08B 3/02; B08B 2203/0217; B08B 1/32; H01L 21/67051; H01L 21/67046; H01L 21/68728; H01L 21/02057; H01L 21/0209; H01L 21/6715; H01L 21/68764; H01L 21/68785; H01L 21/68792
See application file for complete search history.

(56) References Cited

U.S. PATENT DOCUMENTS

| | | | |
|---|---|---|---|
| 2007/0181153 A1* | 8/2007 | Kobayashi | B08B 1/32 134/2 |
| 2012/0014689 A1* | 1/2012 | Ookouchi | H01L 21/02087 15/97.1 |
| 2013/0206171 A1* | 8/2013 | Kurusu | H01L 21/67046 15/21.1 |
| 2018/0151343 A1* | 5/2018 | Takiguchi | H01L 21/02013 |
| 2021/0249253 A1* | 8/2021 | Mai | H01L 21/67046 |

FOREIGN PATENT DOCUMENTS

JP  2019-106531 A  6/2019

\* cited by examiner

*Primary Examiner* — Erin F Bergner
(74) *Attorney, Agent, or Firm* — Chrisman Gallo Tochtrop LLC

(57) ABSTRACT

A substrate cleaning apparatus includes a holder configured to hold a substrate; a circular ring-shaped body; grooves formed in a radial shape at an upper portion of the circular ring-shaped body, each groove having a bottom located on the circular ring-shaped body; a sliding surface which is a top surface of the circular ring-shaped body between the respective grooves, and configured to be slid on a bottom surface of the substrate; a supporting body configured to support and rotate the circular ring-shaped body in a circumferential direction; a cleaning liquid supply configured to allow a cleaning liquid to be absorbed into the circular ring-shaped body; and a relatively moving mechanism configured to move the substrate and the supporting body relative to each other in a state that the sliding surface being rotated and having absorbed the cleaning liquid presses the bottom surface of the substrate.

14 Claims, 9 Drawing Sheets

SUBSTRATE CLEANING APPARATUS AND SUBSTRATE CLEANING METHOD

CROSS-REFERENCE TO RELATED APPLICATION

This application claims the benefit of Japanese Patent Application No. 2022-086344 filed on May 26, 2022, the entire disclosure of which is incorporated herein by reference.

TECHNICAL FIELD

The various aspects and embodiments described herein pertain generally to a substrate cleaning apparatus and a substrate cleaning method.

BACKGROUND

In a manufacturing process for a semiconductor device, a cleaning processing may be performed on a bottom surface of a semiconductor wafer (hereinafter, simply referred to as wafer) as a substrate. Patent Document 1 describes an apparatus configured to perform the cleaning processing.
Patent Document 1: Japanese Patent Laid-open Publication No. 2019-106531

SUMMARY

In one exemplary embodiment, a substrate cleaning apparatus includes a holder configured to hold a substrate; a circular ring-shaped body when viewed from a top, which is an elastic body having open cells; grooves formed in a radial shape at an upper portion of the circular ring-shaped body to connect an inside and an outside of the circular ring-shaped body when viewed from the top, each groove having a bottom located on the circular ring-shaped body; a sliding surface which is a top surface of the circular ring-shaped body between the respective grooves, and configured to be slid on a bottom surface of the substrate; a supporting body configured to rotate the circular ring-shaped body in a circumferential direction and configured to support the circular ring-shaped body such that a sliding unit is not provided in a region surrounded by the circular ring-shaped body when viewed from the top, the sliding unit with respect to the substrate being divided in a rotational direction of the circular ring-shaped body and having a top surface higher than the sliding surface; a cleaning liquid supply configured to allow a cleaning liquid to be absorbed into the circular ring-shaped body; and a relatively moving mechanism configured to move the substrate and the supporting body relative to each other in a transversal direction in a state that the sliding surface of the circular ring-shaped body being rotated and having absorbed the cleaning liquid presses the bottom surface of the substrate, so that the sliding surface and the bottom surface are slid relative to each other.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
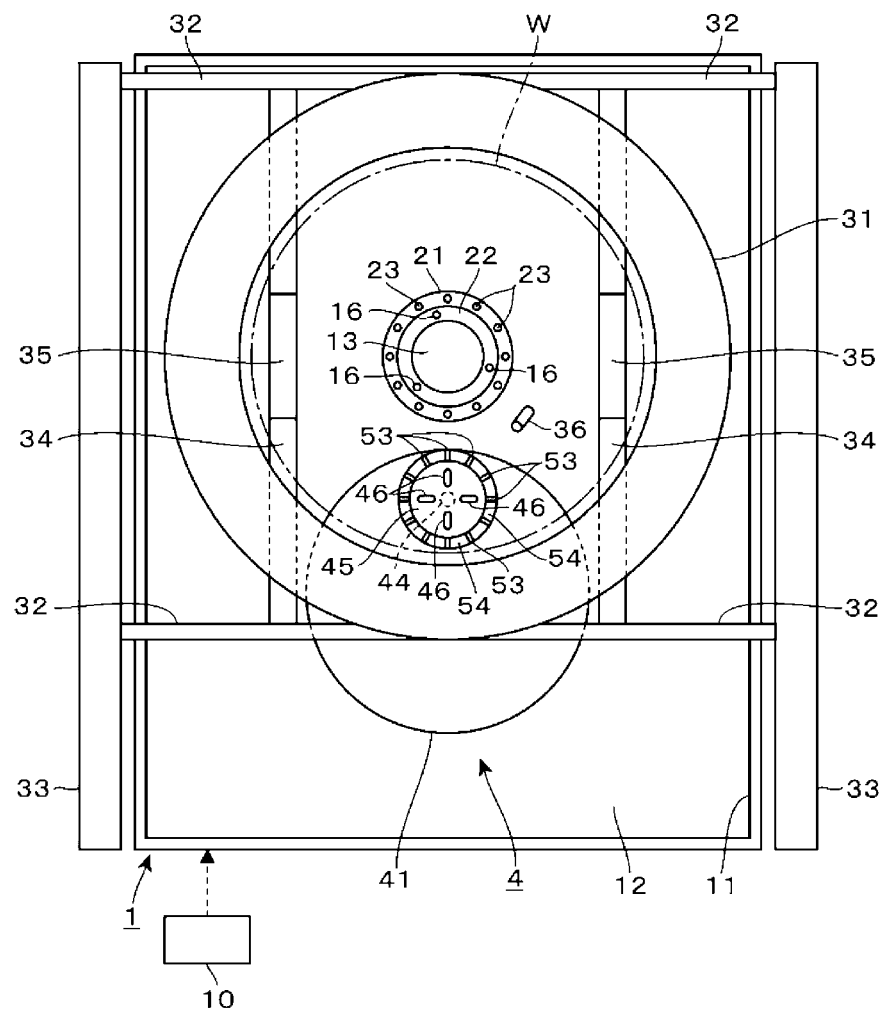
FIG. 1 is a plan view of a substrate cleaning apparatus according to the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A substrate cleaning apparatus 1 as an exemplary embodiment of a substrate cleaning apparatus of the present disclosure will be described. First, the outline of the substrate cleaning apparatus 1 will be described. The substrate cleaning apparatus 1 is configured to perform a cleaning processing on a bottom surface of a wafer W, which is a circular substrate having a diameter of, e.g., 300 mm. This cleaning processing is performed by sliding a sliding body 51 to be described later with respect to the bottom surface of the wafer W on which a cleaning liquid is supplied. The cleaning liquid is, for example, pure water. In the present exemplary embodiment, the sliding body 51 slides on the entire bottom surface of the wafer W except for a periphery thereof, so that the cleaning processing is performed.

The cleaning processing of the bottom surface of the wafer W described above is performed in the order of a central portion of the wafer W and a portion (peripheral side) outside the central portion. During the cleaning, a region on the bottom surface of the wafer W different from a region on which the cleaning is performed is held. Hereinafter, the cleaning processing of the central portion of the bottom surface of the wafer W and the cleaning processing of the peripheral side will be simply referred to as a central cleaning and a peripheral cleaning, respectively.

There are some occasions when a hydrophobic film is formed on the bottom surface of the wafer W, creating a state in which a contact angle of the bottom surface of the wafer W with respect to the pure water is relatively high. In some cases, it is required to perform the cleaning processing through the supply of the cleaning liquid and the sliding of the sliding body on the bottom surface of the wafer W in such a state. Further, in cleaning the bottom surface of the wafer W, it is found out that a relatively large number of particles may remain on the wafer W after being subjected to the cleaning processing, depending on the configuration of the sliding body or processing conditions.

This is presumed to be because, even if the cleaning liquid is supplied on the surface of the hydrophobic film forming the bottom surface of the wafer W, the cleaning liquid bounces off, making it difficult to form a liquid film at an interface between the sliding body and the wafer W. More specifically, it is deemed to be because, as the sliding body and the wafer W come into direct contact with each other without the liquid film therebetween to be slid against each other, a relatively large frictional force acts on the sliding body, causing the sliding body to be torn off and broken into particles. In addition, as will be described later in detail, it is also assumed to be because the cleaning liquid scatters from a position on the peripheral side of the bottom surface of the wafer W. The substrate cleaning apparatus 1 is configured to suppress particles from being left on the bottom surface of the wafer W after the cleaning as described above.

Figure 2:
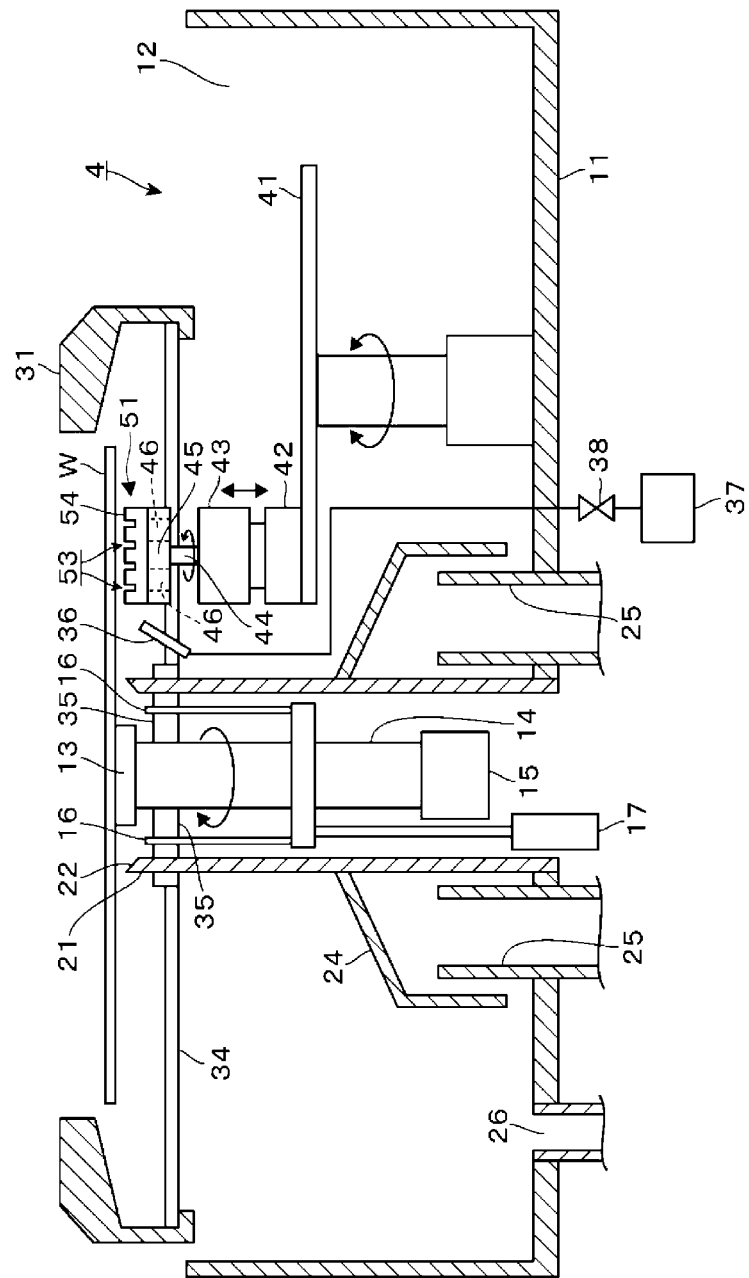
FIG. 2 is a side view of the substrate cleaning apparatus.

Hereinafter, a configuration of the substrate cleaning apparatus 1 will be described with reference to a plan view of FIG. 1 and a side view of FIG. 2. The wafer W on which the hydrophobic film is formed, for example, is transferred to the substrate cleaning apparatus 1, and the substrate cleaning apparatus 1 cleans the bottom surface of the wafer W. As for the hydrophobic film before the cleaning, the contact angle with respect to pure water is equal to or larger than, e.g., 70°, more specifically, equal to or larger than, e.g., 80°.

The substrate cleaning apparatus 1 includes a base body 11, a spin chuck 13, supporting pins 16, a cylindrical member 21, a cup 31, a cleaning processing unit 4, and a cleaning liquid nozzle 36. The base body 11 is formed in a rectangular shape when viewed from the top, and the wafer W is transferred to the substrate cleaning apparatus 1 from one end side of the base body 11 in a lengthwise direction by a non-illustrated transfer mechanism provided outside the substrate cleaning apparatus 1. Hereafter, this one end side will be referred to as a front side.

The base body 11 is provided with a rectangular recess 12 in a plan view with a front-rear direction as a longitudinal direction. In the plan view, at a central portion of the recess 12 in a left-right direction, the spin chuck 13 is provided at a position closer to the front side than a center of the recess 12 in the front-rear direction. During the peripheral cleaning, the spin chuck 13 attracts the central portion of the rear surface of the wafer W and holds the wafer W horizontally.

The spin chuck 13 is connected to a rotating mechanism 15 via a vertically extending shaft 14, and is rotated about a vertical axis by the rotating mechanism 15 constituting a substrate rotating mechanism. The wafer W is held such that the center thereof coincides with a rotation center of the spin chuck 13 when viewed from the top, and the wafer W is rotated clockwise by the rotation of the spin chuck 13 when viewed from the top.

The vertically extending supporting pins 16 are arranged to surround the shaft 14. Lower ends of the supporting pins 16 are connected to an elevating mechanism 17, and the supporting pins 16 can be moved up and down in a vertical direction by the elevating mechanism 17. These supporting pins 16 enable the wafer W to be transferred between the aforementioned transfer mechanism, the spin chuck 13, and a forward/backward moving chuck 35 to be described later.

A cylindrical member 21 extending vertically upwards from a bottom of the base body 11 is disposed so as to surround the shaft 14 and the supporting pins 16. An upper end surface of the cylindrical member 21 forms an inclined surface 22 inclined inwardly, and an upper end of this inclined surface 22 is close to the bottom surface of the wafer W held by the spin chuck 13. Discharge openings 23 for a gas are provided in the inclined surface 22 at a certain interval therebetween in a circumferential direction of the cylindrical member 21. During the peripheral cleaning, since the cleaning liquid adheres to the central portion of the bottom surface of the wafer W, the gas is discharged from the discharge openings 23. Further, the discharge of the gas is also performed in order to dry the center portion of the bottom surface of the wafer W during a period until the peripheral cleaning (second cleaning) is performed after the central cleaning (first cleaning) is completed. In addition, the upper end surface of the cylindrical member 21 may be formed as a flat surface (horizontal surface).

A circular cover 24 is extended from an outer surface of the cylindrical member 21 to the outside of the cylindrical member 21, and a circumferential periphery of the circular cover 24 is bent downwards. An exhaust pipe 25 standing upright at the outside of the cylindrical member 21 is provided at a bottom of the recess 12 formed by the base body 11, and an upper end of the exhaust pipe 25 is opened to a space surrounded by the cover 24 and the cylindrical member 21. The inside of the recess 12 is evacuated through this exhaust pipe 25 during the processing of the wafer W. Further, a drain opening 26 is opened at the bottom of the recess 12 of the base body 11, and a waste liquid that has fallen from the wafer W into the recess 12 is removed from the drain opening 26. Illustration of the cover 24, the exhaust pipe 25 and the drain opening 26 is omitted in FIG. 1.

Now, the cup 31 will be described. The cup 31 has a cylindrical shape with no bottom. An upper end of the cup 31 forms a ring protruding to the inside of the cup 31. In the central cleaning and the peripheral cleaning, the cup 31 surrounds the side circumference of the wafer W to suppress the cleaning liquid from being scattered around. Supporting arms 32 are extended in the left-right direction from a front end portion and a rear end portion of the cup 31, respectively. Leading ends of these supporting arms 32 are connected to the moving mechanism 33, and the cup 31 can be moved in the front-rear direction and can be moved up and down by the moving mechanism 33.

Inside the cup 31, there are provided two bridges 34 extending in the front-rear direction with the spin chuck 13 therebetween from the left and the right thereof, and both ends of each bridge 34 are connected to an inner surface of the cup 31. The forward/backward moving chuck 35 is provided at a central portion of each bridge 34 in a lengthwise direction thereof. Accordingly, the forward/backward moving chuck 35 can be moved forward and backward along with the cup 31 as well as being movable up and down. During the central cleaning, a portion of the bottom surface of the wafer W near a left end thereof and a portion near a right end thereof at the central portion in the front-rear direction are respectively attracted by the forward/backward moving chucks 35, so that the wafer W is held horizontally.

When the wafer W is held by the forward/backward moving chucks 35 and the spin chuck 13, the center of the wafer W coincides with the center of the cup 31 when viewed from the top. That is, the cup 31 can be moved to a position where the center of the cup 31 is coincident with the center of the spin chuck 13 when viewed from the top, and this position is referred to as a reference position of the cup 31. Both of FIG. 1 and FIG. 2 show the cup 31 located at the reference position.

A cleaning liquid nozzle 36 is provided at the rear of the cylindrical member 21 in the recess 12 of the base body 11. The cleaning liquid nozzle 36 is disposed so as to be able to supply the cleaning liquid to the central portion of the bottom surface of the wafer W during the central cleaning by discharging the cleaning liquid obliquely upwards toward the rear, for example. The cleaning liquid is supplied to the cleaning liquid nozzle 36 from a source 37 of the cleaning liquid. A valve 38 is provided in a pipeline connecting the cleaning liquid nozzle 36 and the source 37. As the valve 38 is opened and closed, the supply and the stop of the supply of the cleaning liquid to the cleaning liquid nozzle 36 are switched, so that the discharge of the cleaning liquid from the cleaning liquid nozzle 36 and the stop of the discharge are switched. The cleaning liquid nozzle 36 and the valve 38 constitute a cleaning liquid supply.

Further, the cleaning processing unit 4 is disposed on the rear of the cylindrical member 21 within the recess 12. The cleaning processing unit 4 includes a rotary table 41, an elevating mechanism 42, a rotating mechanism 43, a shaft 44, a base plate 45, and the sliding body 51. The rotary table 41 has a circular shape when viewed from the top, and is rotatable around a vertically extending central axis. The elevating mechanism 42 is provided at a peripheral portion on the front side on the rotatory table 41, and the rotating mechanism 43 is configured to be movable up and down by the elevating mechanism 42. A lower end of the vertically extending shaft 44 is connected to the rotating mechanism 43. When viewed from the top, the shaft 44 is provided eccentrically forward with respect to a rotation center of the rotary table 41, and an upper end of the shaft 44 is connected to the base plate 45. The sliding body 51 is provided on this base plate 45.

By the rotation of the above-described rotary table 41, the sliding body 51 can be turned around the central axis of the rotary table 41 as a pivot, and is moved left and right like a pendulum when the central cleaning is performed. Further, when the sliding body 51 is moved up and down by the elevating mechanism 42, a sliding surface 54 in the sliding body 51, which will be described later, is switched between a state in which it is pressed against the bottom surface of the wafer W and a state in which it is distanced away from the bottom surface of the wafer W.

Figure 3:
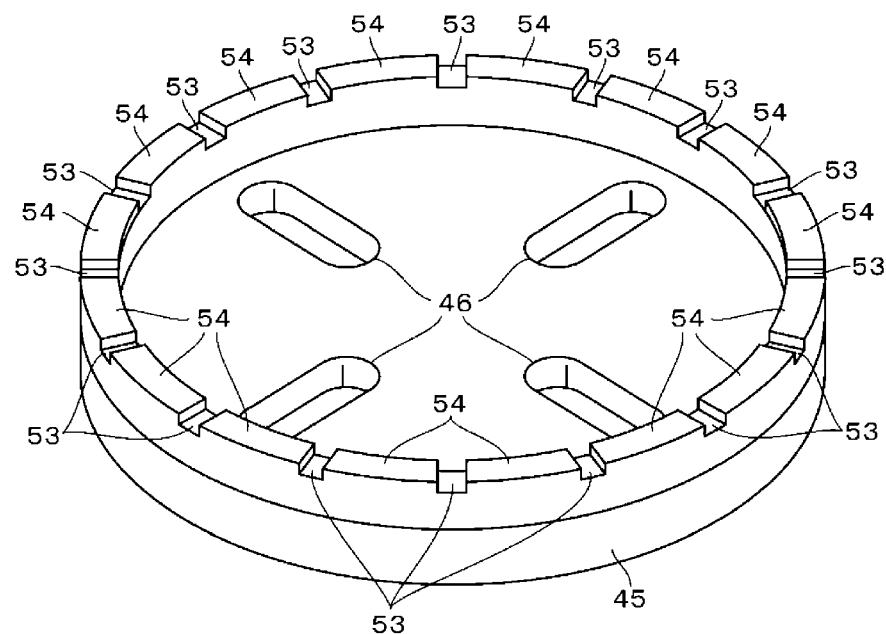
FIG. 3 is a perspective view of a sliding body provided in the substrate cleaning apparatus.
Figure 4:
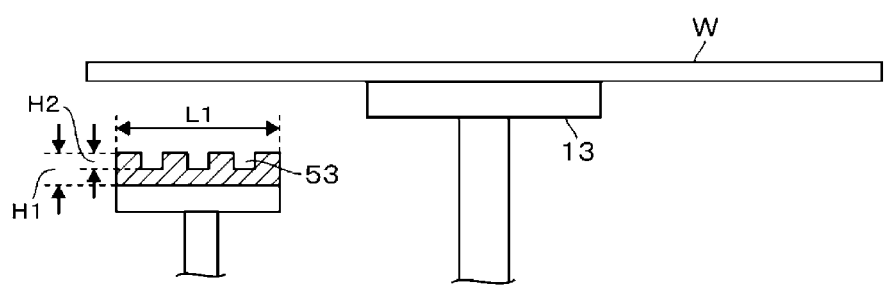
FIG. 4 is a side view of the sliding body.

The base plate 45 and the sliding body 51 will be described with reference to a perspective view of FIG. 3 and a side view of FIG. 4. These drawings illustrate the sliding body 51 in the state where it is apart from the wafer W and is not pressed. The base plate 45 is formed in a horizontal disc shape, and is a rigid member. The aforementioned shaft 44 is connected to a center of a bottom surface of the base plate 45. The sliding body 51 is configured as a circular ring-shaped body along the periphery of the base plate 45 when viewed from the top. Therefore, the sliding body 51 is rotated in a circumferential direction by the above-described rotating mechanism 43. The rotation direction of the sliding body 51 is counterclockwise when viewed from the top. Therefore, the rotation direction of the sliding body 51 and the rotation direction of the wafer W are in opposite directions, which enhances a cleaning effect. Further, an outer diameter L1 of the sliding body 51 is, for example, 65 mm, which is smaller than the radius of the wafer W.

Figure 5:
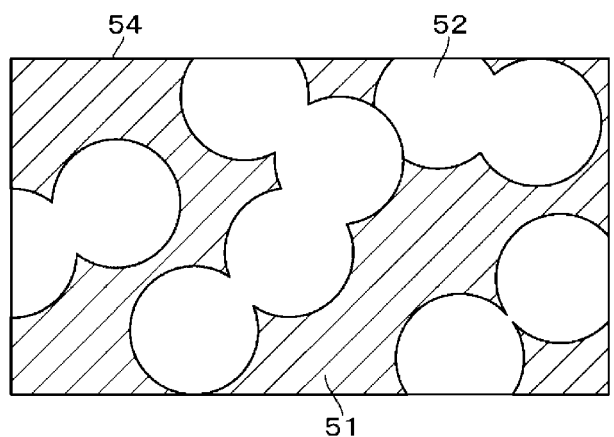
FIG. 5 is a side view illustrating an enlargement of a part of the sliding body.

FIG. 5 presents a longitudinal side sectional view of a certain portion of the sliding body 51. The sliding body 51 is made of an elastic body. For example, it is made of a resin formed as a single body. Specifically, this resin may be, by way of non-limiting example, polyvinyl alcohol. The sliding body 51 is a sponge-shaped member equipped with open cells (interconnected bubbles) 52. That is, a large number of pores are formed in the sliding body 51, and the pores are connected to each other. Therefore, the sliding body 51 can absorb the above-described cleaning liquid to store it in the open cells 52.

On a top surface of the sliding body 51, a plurality of grooves 53 are formed at an equal distance therebetween in a circumferential direction of the sliding body 51. When viewed from the top, these grooves 53 are formed in a radial shape so that the inside and outside of the sliding body 51 forming the circular ring may communicate with each other. A bottom of this groove 53 is located above a lower end of the sliding body 51. That is, the bottom of the groove 53 is formed by the sliding body 51, and a depth H2 of each groove 53 is smaller than a height H1 of the sliding body 51. Therefore, the sliding body 51 is not divided by the grooves 53, and the sliding body 51 is formed as the single body as described above.

Top surfaces between the grooves 53 of the sliding body 51 are horizontal, and each of these top surfaces is configured as the sliding surface 54 that is pressed against the bottom surface of the wafer W and slid on the bottom surface of the wafer W to clean it. Thus, the plurality of sliding surfaces 54 are spaced apart from each other in the circumferential direction of the sliding body 51, and each sliding surface 54 is formed in an arc shape when viewed from the top. Further, since the whole sliding body 51 is formed of the aforementioned elastic body, the above-described open cells 52 are also formed in the sliding surface 54. Therefore, when the sliding body 51 containing the cleaning liquid is pressed against the bottom surface of the wafer W, the sliding body 51 is crushed, and the cleaning liquid is exuded from the sliding body 51 as much as the crushed amount of the sliding body 51. This cleaning liquid is supplied to the interface between the sliding surface 54 and the wafer W and to the vicinity of the sliding surface 54.

A drain opening 46 is provided in a region of the base plate 45 surrounded by the sliding body 51. The drain opening 46 is formed through the base plate 45 in a thickness direction thereof, and is disposed at a position deviated from the center of the sliding body 51 so as not to interfere with the shaft 44. The cleaning liquid supplied onto the base plate 45 flows to the bottom of the base body 11 via the drain opening 46 as a waste liquid to be removed. In the present exemplary embodiment, four drain openings 46 are provided, forming slits each extending from a center side of the sliding body 51 to a peripheral side thereof. The drain openings 46 are arranged at an equal distance therebetween in the circumferential direction of the base plate 45.

Figure 6:
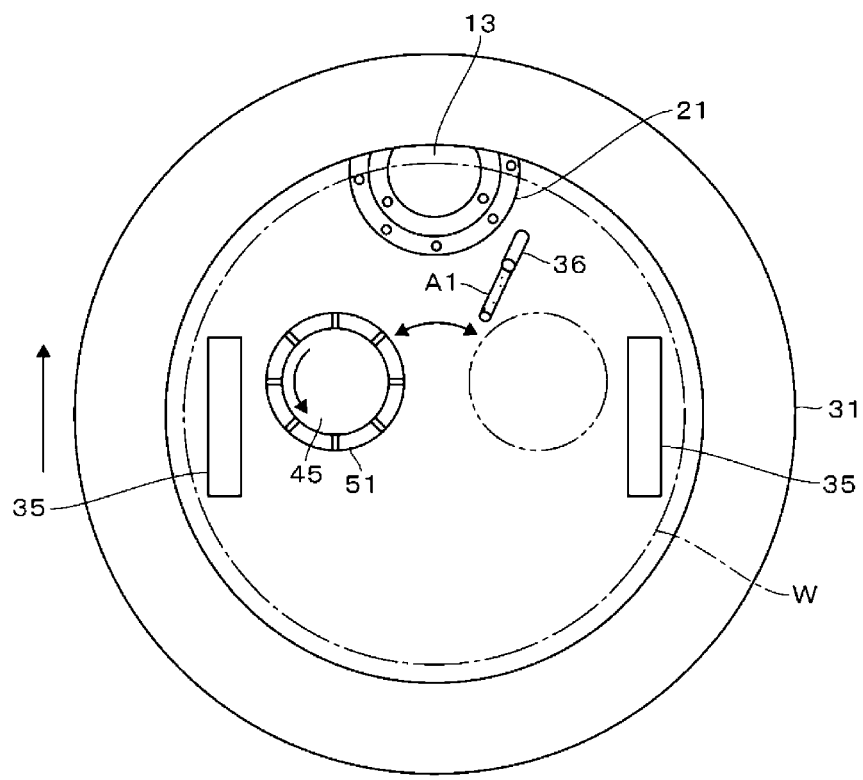
FIG. 6 is a plan view of the substrate cleaning apparatus when a central cleaning is performed.
Figure 7:
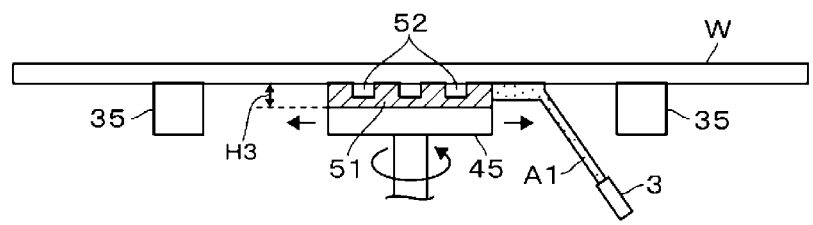
FIG. 7 is a side view of the sliding body when the central cleaning is performed.

FIG. 6 and FIG. 7 are a plan view and a side view of the sliding body 51, respectively, at the time of performing the central cleaning. The operation of the substrate cleaning apparatus 1 during the central cleaning will be described. The wafer W is attracted and held by the forward/backward moving chuck 35. In the state that the sliding body 51 being rotated is pressed against the central portion of the bottom surface of the wafer W, the sliding body 51 is moved left and right through the turning motion thereof. Further, in parallel with the rotation and the left-right movement of the sliding body 51, the cup 31 and the forward/backward moving chuck 35 are moved from the rear side to the front side by the moving mechanism 33. In parallel with these relative movements of the sliding body 51 being rotated with respect to the central portion of the bottom surface of the wafer W, the cleaning liquid is discharged from the cleaning liquid nozzle 36 to the central portion of the bottom surface of the wafer W, so that the cleaning processing is performed. Further, A1 in the drawing denotes a liquid flow of the cleaning liquid discharged from the cleaning liquid nozzle 36.

Figure 8:
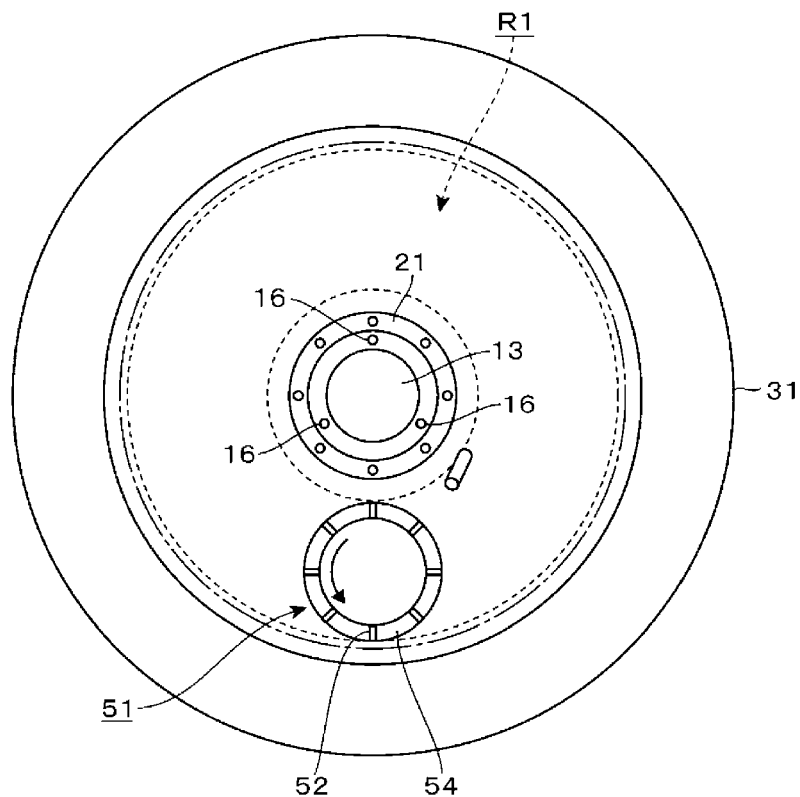
FIG. 8 is a plan view of the substrate cleaning apparatus when a peripheral cleaning is performed.
Figure 9:
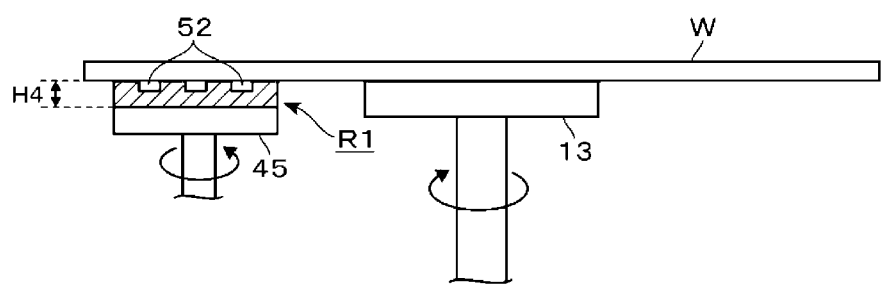
FIG. 9 is a side view of the sliding body when the peripheral cleaning is performed.

FIG. 8 and FIG. 9 are a plan view and a side view of the sliding body 51, respectively, at the time of performing the peripheral cleaning. The operation of the substrate cleaning apparatus 1 during the peripheral cleaning will be described. The bottom surface of the cleaned central portion of the wafer W is attracted and held by the spin chuck 13. As the spin chuck 13 is rotated in the state that the sliding body 51 being rotated is pressed against a peripheral region R1 of the wafer W, the cleaning processing is performed. When this peripheral cleaning is performed, the discharge of the cleaning liquid from the cleaning liquid nozzle 36 to the wafer W is not performed. By performing the central cleaning as described above, the cleaning liquid is absorbed into the sliding body 51. The peripheral cleaning is performed by using the cleaning liquid exuded from the sliding body 51 to the bottom surface of the wafer W as the sliding body 51 is pressed.

The peripheral region R1 (that is, a region outer than the central portion) of the bottom surface of the wafer W, which is cleaned as the sliding body 51 is pressed thereon during the peripheral cleaning, has a circular ring shape. An inner edge of the peripheral region R1 is closer to the center of the wafer W than an edge of the region on which the central cleaning is performed, or coincides with the edge of the region on which the central cleaning is performed. By performing the central cleaning and the peripheral cleaning as described above, a circular region extending from the center of the wafer W to a position near the circumferential edge of the wafer W is cleaned. As stated above, the circular region on which the cleaning is performed is approximately the entire bottom surface of the wafer W.

In FIG. 7, the height of the sliding body 51 in the crushed state during the central cleaning is denoted by H3. Further, in FIG. 9, the height of the sliding body 51 in the crushed state during the peripheral cleaning is denoted by H4. The height of the sliding body 51 and the depth H2 of the groove 53 by the elevating mechanism 42 during the cleaning are set so that the depth H2 of each groove 53 shown in FIG. 4 becomes larger than a crushed height (H1-H3) of the sliding body 51 during the central cleaning and a crushed height (H1-H4) of the sliding body 51 during the peripheral cleaning. Therefore, when the central cleaning and the peripheral cleaning are performed, although the height of the groove 53 is reduced by a pressing force applied to the sliding body 51 from the wafer W, the groove 53 is left while being not completely crushed, as shown in FIG. 7 and FIG. 9.

Figure 10:
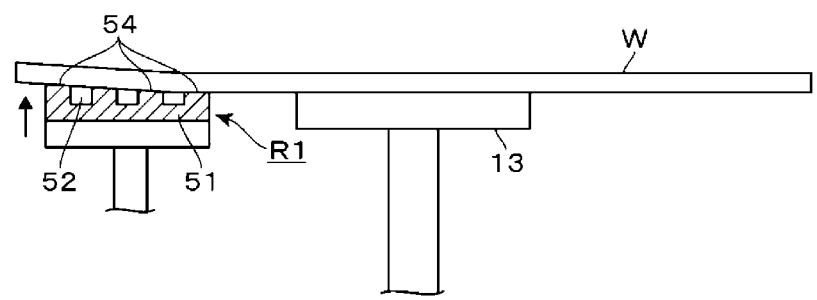
FIG. 10 is a side view of the sliding body when the peripheral cleaning is performed.

Further, when the peripheral cleaning is performed, there may be an occasion where the periphery of the wafer W is bent upwards as the sliding body 51 is pressed. Due to the presence of the open cells 52 and the elasticity thereof, the sliding body 51 is configured to be transformed by conforming to the bending, and the height of the sliding body 51 at the time of the pressing is set. Specifically, as shown in FIG. 10, the diameter of the pores constituting the open cells 52 and the porosity of the sliding body 51 by the open cells 52 are set so that the sliding body 51 can be transformed to maintain the state in which each sliding surface 54 is in firm contact with the bottom surface of the wafer W. In addition, the height H4 of the sliding body 51 in the crushed state during the peripheral cleaning described in FIG. 9 is assumed to be the height when the wafer W is regarded as a horizontal substrate without being bent at all.

Now, the reason why the configuration of the sliding body 51 and the aspects of the cleaning processing are adopted as the above-described configuration and aspects will be explained as follows. It is confirmed by experiments that adhesion of particles to the bottom surface of the wafer W is reduced by adopting these configuration and aspects. In this regard, the explanation of the reason for the configuration of the sliding body 51 and the aspects of the cleaning processing to be described below is also inference as to the reason why good results are obtained in the experiments.

First, the sliding body 51 is configured as the circular ring-shaped body when viewed from the top. The reason of this configuration will be explained by citing a sliding body of Comparative Example 1 having the same size and the same material as the sliding body 51 when viewed from the top and having a circular contact surface as an example.

Regarding the sliding body 51, its contact area with respect to the bottom surface of the wafer W is smaller than that of the sliding body of Comparative Example 1. Thus, when the sliding body 51 is pressed against the wafer W with a predetermined force, a large pressing force is applied to the contact surface of the wafer W, and a frictional force on the bottom surface of the wafer W is reduced. For this reason, cleaning efficiency can be increased, and generation of particles as a result of the sliding body 51 being torn off can be reduced. In addition, by adopting such a configuration in which the contact area is small in this way, the volume of the sliding body 51 is smaller than that of the sliding body of Comparative Example 1. That is, since a portion of the sliding body 51 that might be torn off to cause the particle generation is small, the generation of particles from the sliding body 51 is reduced for this reason as well.

Furthermore, since the sliding member 51 is the circular ring-shaped body, even if the particles are generated, the particles moved to the inside of the circular ring-shaped body are confined therein, and the scattering of the particles to the outside of the ring-shaped body is suppressed. The particles confined in the circular ring-shaped body are removed through the drain opening 46 of the base plate 45. Thus, it is assumed that adhesion of the particles to the bottom surface of the wafer W is suppressed in the sliding body 51.

Meanwhile, considering that the volume of the sliding body and the contact area upon the bottom surface of the wafer W are set to be small in cleaning the wafer W by using the sliding body, the sliding body is not limited to being configured by the circular ring-shaped body like the sliding body 51. For example, it is conceivable to use a linear sliding body in a plan view along the diameter of the base plate 45. Here, the linear sliding body is referred to as the sliding body of Comparative Example 2.

In performing the cleaning processing, the sliding body is rotated. However, the thickness of the sliding body of Comparative Example 2 is small when viewed in this rotational direction. Accordingly, when a stress applied in the rotational direction is large due to the frictional force between the bottom surface of the wafer W and the sliding body, the sliding body of Comparative Example 2 may fall down in the rotational direction because the strength of the sliding body against the stress is small. In this case, a sufficient contact area of the sliding body of Comparative Example 2 with respect to the bottom surface of the wafer W may not be obtained, resulting in reduction of cleaning power or causing the sliding body to be torn off to become the particles.

Meanwhile, since the sliding body 51 is the circular ring-shaped body along the rotational direction, it has a large thickness when viewed in this rotational direction and has high strength against the stress applied in the rotational direction. Therefore, since the sliding body 51 is suppressed from falling over, the reduction in cleaning power and the generation of particles as a result of the sliding body 51 being torn off may be suppressed. In addition, the thickness of the sliding body 51 when viewed from the top may be in the range of, e.g., 3 mm to 5 mm so that the sufficient cleaning effect is obtained and the aforementioned falling down is suppressed more reliably.

Now, the reason why the groove 53 is formed at the sliding body 51 and why this groove 53 remains uncrushed when the sliding body 51 is pressed against the wafer W in the central cleaning and the peripheral cleaning as described in FIG. 7 and FIG. 9, respectively, will be explained. Since the groove 53 is not crushed as stated above, an angled portion is formed by the groove 53 and an end portion of the sliding surface 54. During the central cleaning and the peripheral cleaning, this angled portion serves to scrape away a foreign matter adhering to the rear surface of the wafer W. That is, since a pressure from the angled portion is applied sideways to the foreign material as well as the pressing force of the sliding surface 54 from below, the cleaning effect is enhanced as compared to the case where the groove 53 is not formed. Also, the bottom of this groove 53 is located on the sliding body 51. That is, since the bottom of the groove 53 does not reach the bottom surface of the sliding body 51, the sliding body 51 is not divided in the rotational direction. Therefore, the sliding body 51 has sufficient strength against the stress applied in the rotational direction, so that the aforementioned falling down is suppressed.

In addition, since the groove 53 remains when the sliding body 51 is pressed in both the central cleaning and the peripheral cleaning, the cleaning liquid outside the sliding body 51 can be introduced to the inside of the sliding body 51 via the groove 53 when the sliding body 51 being rotated and the bottom surface of the wafer W are moved relative to each other. This introduced cleaning liquid may include the cleaning liquid discharged from the cleaning liquid nozzle 36 and liquid droplets of the cleaning liquid adhering to the bottom surface of the wafer W.

As the cleaning liquid is introduced in this way, the cleaning liquid is easily diffused throughout the sliding body 51, so that the liquid film is more securely formed between the bottom surface of the wafer W and each sliding surface 54, thus suppressing the direct contact between the bottom surface of the wafer W and each sliding surface 54. Therefore, the generation of particles as a result of the sliding body 51 being torn off due to the friction is more reliably suppressed. In addition, the number of the grooves 53 is not limited to the shown example, and may be selected as required in consideration of the strength of the sliding body 51 in the rotational direction described above, the cleaning performance of the sliding body 51, and the effect of the introduction of the cleaning liquid to the inside of the sliding body 51 from the outside thereof.

By the way, on the base plate 45, no other sliding body is provided in the region surrounded by the sliding body 51. However, it may be assumed that another sliding body is provided in the region surrounded by the sliding body 51 and a sliding surface (top surface) of this another sliding body is higher than the sliding surface 54. Further, it may be also assumed that this another sliding body is divided in a rotational direction of the sliding body 51. The fact that the sliding body is divided in the rotational direction means that a groove is formed at the sliding body so as to extend from an upper end of the sliding body to a lower end thereof. In such a case, this another sliding body may come into contact with the wafer W more easily as compared to the sliding body 51, and it may easily fall down as stated in the description of the groove 53, raising a concern that the particles might be generated. That is, if this another sliding body is provided, the particle-suppressing effect of the above-described sliding body 51 may not be achieved efficiently. Thus, there is not adopted such a configuration in which this another sliding body (sliding unit) is provided.

Now, the aspect of the cleaning processing will be discussed. As described above, the discharge of the cleaning liquid from the cleaning liquid nozzle 36 is performed only during the central cleaning in the central cleaning and in the peripheral cleaning. Regarding the reason for this, when performing the cleaning by relatively moving the sliding body of any shape with respect to the bottom surface of the wafer W, it is desirable that the liquid film is interposed between the sliding body and the bottom surface of the wafer W in order to suppress the generation of particles from the sliding body, as stated so far. In order to reliably form this state in which the liquid film is interposed, it may be considered to set a discharge amount of the cleaning liquid from the cleaning liquid nozzle 36 to be relatively large. However, when the water repellency of the bottom surface is relatively high as in the wafer W of the present exemplary embodiment, the cleaning liquid discharged from the cleaning liquid nozzle 36 bounces off the bottom surface of the wafer W due to an impact upon the landing thereof and the water repellency of the wafer W.

For example, if the cleaning liquid is discharged from the cleaning liquid nozzle 36 to the peripheral region R1 of the bottom surface of the wafer W at a relatively large discharge amount during the peripheral cleaning, a large amount of cleaning liquid may bounce off and scatter at a position of the wafer W near the circumferential edge thereof. There may be a risk that liquid droplets of the cleaning liquid scattered from the position near the circumferential edge reach an inner surface of the cup 31 and bounce again, adhering to the top surface and the bottom surface of the wafer W to become the particles. As a result, the particles on the bottom surface of the wafer W may not be sufficiently reduced. In order to suppress this problem, the cleaning liquid is not discharged from the cleaning liquid nozzle 36 during the peripheral cleaning, as stated above, and the liquid film between the sliding body 51 and the peripheral region R1 is formed by using the cleaning liquid that is contained in the sliding body 51 at the end of the central cleaning.

Figure 11:
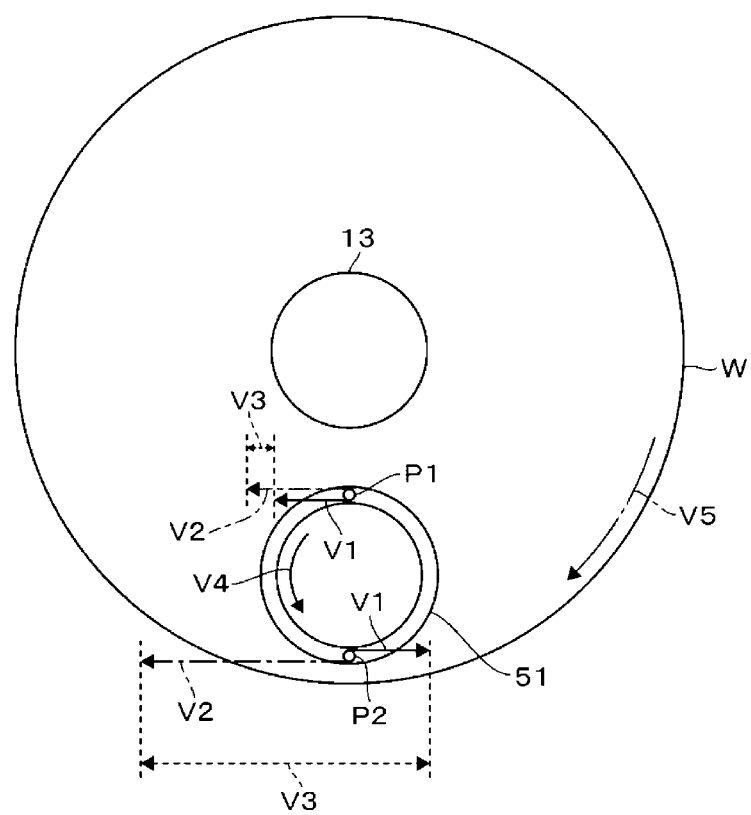
FIG. 11 is a plan view for describing a relative velocity between a wafer and the sliding body.
Figure 12:
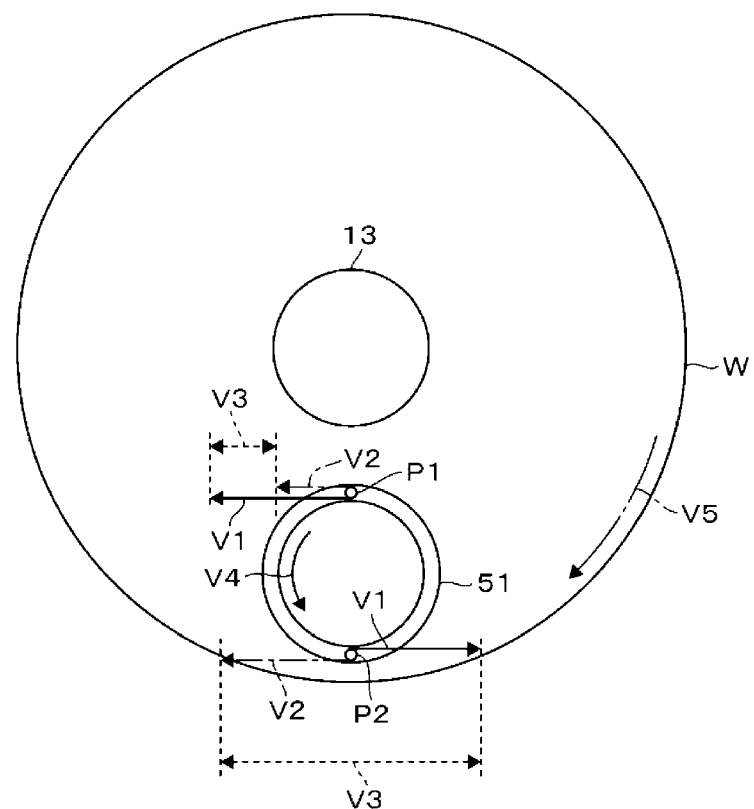
FIG. 12 is a plan view for describing the relative velocity between the wafer and the sliding body.

By the way, an example of the rotational speed of the sliding body 51 and the rotational speed of the wafer W in the peripheral cleaning will be described below with reference to the schematic plan views of FIG. 11 and FIG. 12. In FIG. 11 and FIG. 12, in a region where the sliding body 51 is disposed on the peripheral region R1 where the cleaning is being performed, a position closest to the center of the wafer W and a position farthest from the center of the wafer W are indicated as an inner peripheral position P1 and an outer peripheral position P2, respectively. Further, in the drawing, the magnitude of the speed of the sliding body 51 and the magnitude of the speed of the wafer W due to the rotation at the inner peripheral position P1 and the outer peripheral position P2 are represented by vector components starting from the inner peripheral position P1 and the outer peripheral position P2. These vector components follow tangent lines (not shown) drawn to intersections of straight lines passing through the inner peripheral position P1 and the outer peripheral position P2 and the circumferential edge of the wafer W.

The vector component of the rotational speed of the sliding body 51 and the vector component of the rotational speed of the wafer W are indicated by arrows V1 and V2, respectively. Further, a relative speed between the sliding body 51 and the wafer W at each of the inner peripheral position P1 and the outer peripheral position P2 is indicated by a bidirectional arrow V3 having a length corresponding to a distance between leading ends of the arrows V1 and V2. Therefore, the larger the relative speed is, the longer the bidirectional arrow V3 may be. In the drawings, the rotational direction of the sliding body 51 and the rotational direction of the wafer W are indicated by an arrow V4 and an arrow V5, respectively.

FIG. 11 shows an example in which the peripheral cleaning is performed by setting the rotational speed of the sliding body 51 to 300 rpm and the rotational speed of the wafer W to 50 rpm, respectively, and this setting is referred to as Rotation Setting 1. FIG. 12 shows an example in which the peripheral cleaning is performed by setting the rotational speed of the sliding body 51 to 500 rpm and the rotational speed of the wafer W to 30 rpm, respectively, and this setting is referred to as Rotation Setting 2. Comparing the state of the wafer W after the processing in each of Rotation Settings 1 and 2, the particles on the inner periphery of the peripheral region R1 and the vicinity thereof are found to be smaller in Rotation Setting 2. It is assumed to be because the relative speed (bidirectional arrow V3) at the inner peripheral position P1 is large in Rotation setting 2 as shown in the drawings. Further, In both cases of Rotation Settings 1 and 2, the particles are sufficiently suppressed from being left on the outer periphery of the peripheral region, and no significant difference in the residual particle state is observed therebetween.

In Rotation Setting 1, the rotational speed of the sliding body 51 and the rotational speed of the wafer W at the inner peripheral position P1 are 1021 mm/sec and 434.6 mm/sec, respectively, and the rotational speed of the sliding body 51 and the rotational speed of the wafer W at the outer peripheral position P2 are 1021 mm/sec and 775.6 mm/sec, respectively. Therefore, the relative speed at the inner peripheral position P1 is 1021−434.6=586.4 mm/sec, and the relative speed at the outer peripheral position P2 is 1021+775=1796 mm/sec. In Rotation Setting 2, the rotational speed of the sliding body 51 and the rotational speed of the wafer W at the inner peripheral position P1 are 1701 mm/sec and 260 mm/sec, respectively, and the rotational speed of the sliding body 51 and the rotational speed of the wafer W at the outer peripheral position P2 are 1701 mm/sec and 465 mm/sec, respectively. Therefore, the relative speed at the inner peripheral position P1 is 1701−260=1441 mm/sec, and the relative speed at the outer peripheral position P2 is 1701+465=2166 mm/sec.

When the relative speed is relatively high, the cleaning liquid constituting the liquid film at the interface between the sliding body 51 and the bottom surface of the wafer W is suppressed from being scraped off and disappearing from the corresponding gap due to the relative movement between the sliding body 51 and the bottom surface of the wafer W. To elaborate, since the relative moving speed is high, the cleaning liquid flows greatly in the corresponding gap. The sliding body 51 is promptly moved to another location from the location where the flow occurs. For this reason, the sliding body 51 is continuously moved while the liquid film is maintained between the sliding body 51 and the bottom surface of the wafer W. Since the liquid film is maintained in this way, the cleaning is performed in the state that the frictional force between the sliding body 51 and the bottom surface of the wafer W is maintained relatively low, so that the sliding body 51 is unlikely to be torn off.

Therefore, when the processing is performed under Rotation Setting 2, it is assumed that the particles are suppressed from being left near the inner periphery of the peripheral region R1 as well as being suppressed from being left near the outer periphery of the peripheral region R1 as in the case where the processing is performed in Rotation Setting 1. Further, in Rotation Setting 2, since the cleaning liquid flows greatly near the inner periphery of the peripheral region R1 as stated above, the high cleaning effect can be obtained near the inner periphery of the peripheral region R1.

As described above, a better result is obtained in Rotation Setting 2 (rotational speed of sliding body 51: 500 rpm, rotational speed of wafer W: 30 rpm) than in Rotation Setting 1 (rotational speed of sliding body 51: 300 rpm, rotational speed of wafer W: 50 rpm). In view of this, it is desirable to set the ratio of the rotational speed of the sliding body 51/the rotational speed of the wafer W to be larger than, e.g., 300 rpm/50 rpm=6, and, more desirably, equal to or larger than 500 rpm/30 rpm=16.66. In addition, if the rotational speed of the wafer W is too small, the time required for the cleaning processing may be increased, resulting in reduction in the throughput of the apparatus. Therefore, it is desirable to set the rotational speed of the wafer W to be equal to or larger than 30 rpm.

Here, in order to set the relative speed at the inner peripheral position P1 and the outer peripheral position P2 to be relatively high, it may also be considered to set the rotational speed of the wafer W to be larger than the rotational speed of the sliding body 51. Assume that the rotational speed of the sliding body 51 is 0 rpm. In this case, since the sliding body 51 is the circular ring-shaped body, the number of times each point on the peripheral region R1 in the radial direction passes through the region where the sliding body 51 is located during one rotation of the wafer W is different. Specifically, while a point on the inner periphery of the peripheral region R1 and a point on the outer periphery of the peripheral region R1 pass by the sliding body 51 once, the other points pass twice. Accordingly, if the rotation of the wafer W is repeated, there may be caused large discrepancy in the number of times each point of the peripheral region R1 comes into contact with the sliding body 51 to be cleaned.

To ease the understanding, the rotational speed of the sliding body 51 has been described as being 0 rpm. However, even when the rotational speed of the sliding body 51 is slightly larger than 0 rpm, discrepancy in the number of times of the cleaning may not be sufficiently resolved, and when the cleaning processing takes a relatively short time, there is a risk that there may be a portion that is not sufficiently cleaned. In view of the fact that the discrepancy in the number of times of the cleaning is suppressed when the rotational speed of the sliding body 51 having a diameter smaller than that of the wafer W is set to be higher, it is desirable to set the rotational speed of the sliding body 51 to be higher than the rotational speed of the wafer W for the sake of suppressing the discrepancy in the number of times of the cleaning and suppressing the particle generation by setting the relative speed to be relatively large as stated above.

Referring back to FIG. 1, a configuration of the substrate cleaning apparatus 1 will be described. The substrate cleaning apparatus 1 is equipped with a controller 10. The controller 10 is implemented by a computer, and has a program. In this program, process groups are recorded to allow a series of operations in the substrate cleaning apparatus 1 to be performed. The controller 10 outputs control signals to the individual components of the substrate cleaning apparatus 1 according to the program, so that the operations of the individual components are controlled. Specifically, operations such as the turning of the sliding body 51 by the rotary table 41, the height of the sliding body 51 by the elevating mechanism 42, the rotational speed of the sliding body 51 by the rotating mechanism 43, the rotational speed of the wafer W by the spin chuck 13, the upward/downward movement of the supporting pins 16 by the elevating mechanism 17, and the supply and the stop of the supply of the cleaning liquid to the cleaning liquid nozzle 36 by the opening/closing operations of the valve 38 are controlled. This program is stored in a recording medium such as, but not limited to, a compact disc, a hard disc, a memory card, or a DVD, and is installed to the controller 10.

Further, when the central cleaning is performed, the rotary table 41 and the moving mechanism 33 constitute a relatively moving mechanism configured to move the sliding body 51 relative to the wafer W in a horizontal direction (that is, in a transversal direction), whereas when the peripheral cleaning is performed, the rotating mechanism 15 constitutes the relatively moving mechanism. In addition, the forward/backward moving chuck 35 serves as a holder for the wafer W when the central cleaning is performed, whereas the spin chuck 13 serves as the holder for the wafer W when the peripheral cleaning is performed.

Now, processing operations in the substrate cleaning apparatus 1 will be described in sequence. With the cup 31 located at the reference position, the wafer W is transferred to above the opening of the cup 31 by the transfer mechanism. Then, a part of the peripheral region R1 of the wafer W is held by the forward/backward moving chuck 35 moved to a position higher than the spin chuck 13 via the supporting pins 16. Subsequently, the cup 31 is moved backwards, so that the central portion of the wafer W is positioned at the rear of the cylindrical member 21.

The cleaning liquid is discharged from the cleaning liquid nozzle 36 to the central portion of the bottom surface of the wafer W, and the sliding body 51 is raised and pressed against a position on the bottom surface of the wafer W at the front of the center thereof. Then, the sliding body 51 is rotated and turned left and right, and the cup 31 is moved forwards, so that the central portion of the bottom surface of the wafer W is cleaned as described in FIG. 6 and FIG. 7.

Once the sliding body 51 reaches a preset position at the rear of the center of the wafer W, the turning and the rotation of the sliding body 51 are stopped, and the sliding body 51 is lowered away from the wafer W. Further, the discharge of the cleaning liquid from the cleaning liquid nozzle 36 is stopped. As the sliding body 51 has been in contact with the bottom surface of the wafer W on which the cleaning liquid has been supplied, the cleaning liquid is absorbed in the sliding body 51 when the sliding body 51 is moved away from the wafer W in this way.

Then, the cup 31 is moved forwards toward the reference position, and the gas is discharged from the cylindrical member 21 to be supplied to the bottom surface of the wafer W being moved along with the cup 31, so that the central portion of the bottom surface of the wafer W after being cleaned is dried. The cup 31 having reached the reference position is lowered, the forward/backward moving chuck 35 is located below the spin chuck 13, and the central portion of the bottom surface of the wafer W is attracted to and held by the spin chuck 13 whereas the holding of the wafer W by the forward/backing moving chuck 35 is released.

Subsequently, the sliding body 51 located below the peripheral region R1 of the wafer W is raised and pressed against the peripheral region R1, so that the cleaning liquid from the sliding body 51 is exuded to the peripheral region R1. Then, the wafer W is rotated as the spin chuck 13 is rotated, and, also, the sliding body 51 is rotated. As the wafer W and the sliding body 51 reach the rotational speeds of Rotation Setting 2 described in FIG. 12, the peripheral region R1 is cleaned as described in FIG. 8 and FIG. 9.

Thereafter, the rotation of the sliding body 51 is stopped, and the sliding body 51 is lowered away from the wafer W. After the rotation of the wafer W is carried on and the cleaning liquid is scattered off the peripheral region R1, the rotation of the wafer W is then stopped. Then, the wafer W is handed over to the transfer mechanism via the supporting pins 16 and carried out from the substrate cleaning apparatus 1. By performing the series of processes, the particles are suppressed from being left on the bottom surface of the wafer W that is carried out from the substrate cleaning apparatus 1 after being subjected to the cleaning processing.

Here, a period during which the central cleaning is performed is referred to as T1, and a period during which the peripheral cleaning is performed is referred to as T2. Each of the periods T1 and T2 is a time from when the sliding body 51 being rotated comes into a state in which it is in contact with the wafer W until this state is released (that is, the rotation of the sliding body 51 is stopped or the sliding body 51 is moved away from the wafer W). The height of the crushed sliding body 51 in the periods T1 and T2 will be explained with reference to FIG. 13 and FIG. 14 as well as FIG. 7 and FIG. 9 described above.

Figure 13:
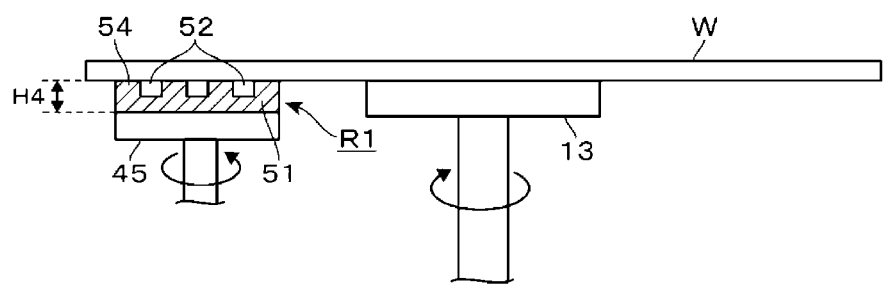
FIG. 13 is a side view of the sliding body when the peripheral cleaning is performed.

Although the height (first height) H3 of the crushed sliding body 51 in the central cleaning and the height (second height) H4 of the crushed sliding body 51 in the peripheral cleaning are shown in FIG. 7 and FIG. 9 to be same, they may be different. For example, as shown in FIG. 13, the crushed amount of the sliding body 51 in the peripheral cleaning may be set to be relatively small, thus allowing the height H3 of the sliding body 51 in the central cleaning to be smaller than the height H4 of the sliding body 51 in the peripheral cleaning (H3<H4).

In this way, if H3<H4, since the pores of the sliding body 51 are large in the peripheral cleaning, the liquid droplets of the cleaning liquid scattered to and remaining on the peripheral region R1 during the central cleaning may be easily absorbed into the sliding body 51 when it comes into contact with the sliding body 51 during the peripheral cleaning. As the cleaning liquid is absorbed in this way, a lack of cleaning liquid required for forming the liquid film at the interface between the sliding body 51 and the peripheral region R1 is suppressed. That is, by more securely suppressing the generation of particles during the cleaning of the peripheral region R1, remaining of the particles on the wafer W after being subjected to the cleaning processing can be suppressed more reliably.

Figure 14:
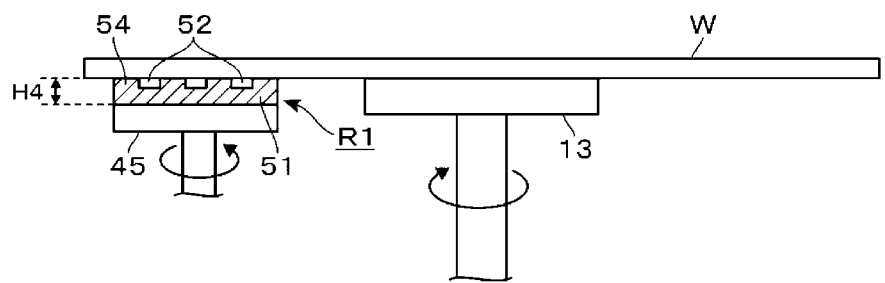
FIG. 14 is a side view of the sliding body when the peripheral cleaning is performed.

Meanwhile, as depicted in FIG. 14, by setting the crushed amount of the sliding body 51 in the peripheral cleaning to be relatively large, the height H3 of the sliding body 51 in the central cleaning may be set to be larger than the height H4 of the sliding body 51 in the peripheral cleaning (H3>H4). In this case, since the crushed amount is relatively small and the pores of the sliding body 51 are large in the central cleaning, the sliding body 51 has a relatively high liquid absorbency with respect to the cleaning liquid. On the other hand, since the crushed amount is relatively large during the peripheral cleaning, the cleaning liquid absorbed during the central cleaning can be sufficiently supplied to the peripheral region R1, so that the particles are more securely suppressed from being left on the wafer W after the processing. Whether to set to be H3>H4 or H3<H4 may be determined by an operator prior to the cleaning processing, depending on the amount of the liquid droplets of the cleaning liquid scattered to and remaining on the peripheral region R1 during the central cleaning.

In addition, although the sliding body 51 has been described to be rotated after being pressed against the wafer W, it may be also possible to press the sliding body 51 against the wafer W after rotating it. At the beginning of the periods T1 and T2, when the base plate 45 supporting the sliding body 51 is raised to press the sliding body 51 being rotated against the wafer W, the crushed amount of the sliding body 51 varies until the base plate 45 reaches a preset height. Likewise, when the sliding body 51 being rotated is lowered at the end of the periods T1 and T2, the crushed amount of the sliding body 51 also varies during the lowering. That is, H3 in the period T1 and H4 in the period T2 are values that can be changed. However, when comparing the minimum values of H3 and H4, for example, the setting of H3>H4 or H3<H4 can be achieved.

Here, the height H4 of the crushed sliding body 51 in the peripheral cleaning may be varied in the period T2 during which the peripheral cleaning is performed. Specifically, the period T2 is divided at a certain time point (time point t1), and the time period before the time point t1 is referred to as a preceding period, and the time period after the time point t1 is referred to as a following period. In the preceding period, as shown in FIG. 13, the height H4 in the peripheral cleaning is set to be larger than the height H3 in the central cleaning. Accordingly, as described above, the absorbency of the liquid droplets attached to the peripheral region R1 to the sliding body 51 is increased.

Then, in the following period, as shown in FIG. 14, the height H4 of the sliding body 51 is set to be smaller than the height H3 in the central cleaning. That is, the crushed height is set to be larger than that in the central cleaning. Accordingly, the bottom surface of the wafer W is replenished with the cleaning liquid exuded from the sliding body 51, so that the lack of the cleaning liquid forming the liquid film at the interface between the sliding body 51 and the wafer W can be suppressed.

Further, immediately after the start of the period T2 on the way the base plate 45 is moved toward the set height at the start of the period T2, the height H4 of the sliding body 51 may decrease with the lapse of time. The aforementioned preceding period and following period do not mean such a period in which the height of the sliding body 51 fluctuates at the beginning of the pressing. For instance, the time point t1 at which the period T2 is divided into the preceding period and the following period is a time point one second after the start of the period T2.

The height H4 of the crushed sliding body 51 may be changed as described above by stopping the base plate 45 at different heights in the preceding period and the following period, respectively. Alternatively, the height H4 of the crushed sliding body 51 may be changed as described above by continuing to raise the base plate 45 from the start of the preceding period to the end of the following period. Further, in the above description, the height H3 of the sliding body 51 in the central cleaning is set to be smaller than the height H4 of the sliding body 51 in the peripheral cleaning (H3<H4) in the preceding period. However, it may be adopted a setting of H3=H4 instead. That is, at an early stage of the peripheral cleaning, the sliding body 51 may be crushed in the same manner as in the central cleaning, and the degree of the crushing may be enhanced near the end of the processing when the cleaning liquid on the bottom surface of the wafer W tends to become insufficient, thus allowing the cleaning liquid to be replenished.

Further, there may be further provided a liquid droplet moving mechanism configured to move a liquid droplet R2 of the cleaning liquid remaining at the central portion of the bottom surface of the wafer W after the completion of the central cleaning to the peripheral region R1, thus allowing the sliding body 51 to absorb the liquid droplet R2 when the peripheral cleaning is performed to thereby enable the liquid film to be securely formed at the interface between the sliding body 51 and the peripheral region R1. The movement of the liquid droplet by this liquid droplet moving mechanism is performed before the central portion of the bottom surface of the wafer W after being subjected to the central cleaning is held by the spin chuck 13.

Figure 15:
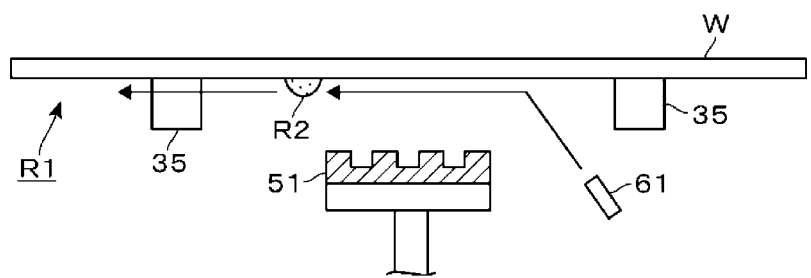
FIG. 15 is a side view of the sliding body after the central cleaning and before the peripheral cleaning.

As an example, the liquid droplet moving mechanism may be implemented by a gas nozzle 61, as illustrated in FIG. 15. The gas nozzle 61 discharges a gas toward the central portion of the bottom surface of the wafer W at a position where the central cleaning is ended. To elaborate, the gas nozzle 61 is provided so as to discharge the gas obliquely upwards from the central side toward the peripheral side of the wafer W. By the action of this gas, the liquid droplet R2 of the cleaning liquid remaining at the central portion of the bottom surface of the wafer W after the central cleaning is moved to the peripheral region R1 so that the sliding member 51 can absorb the liquid droplet R2 when the peripheral cleaning is performed.

Furthermore, the discharge of the gas from the gas nozzle 61 may be performed instead of the gas supply from the cylindrical member 21 to the central portion of the bottom surface of the wafer W when the holding of the wafer W by the forward/backward moving chuck 35 is switched to the holding by the spin chuck 13 as described above. That is, the gas supply from the cylindrical member 21 in the middle of switching the holding may not be performed.

Moreover, the liquid droplet moving mechanism may be configured to hold and rotate the circumferential periphery of the wafer W, and may be configured to move the cup 31 to transfer the wafer W between the forward/backward moving chuck 35 and the liquid droplet moving mechanism. In addition, the liquid droplet R2 at the central portion of the bottom surface of the wafer W may be moved to the peripheral region R1 by a centrifugal force generated when the wafer W is rotated by the liquid droplet moving mechanism.

In the above-described peripheral cleaning, the discharge of the cleaning liquid from the cleaning liquid nozzle 36 is not performed (that is, the supply of the cleaning liquid to the cleaning liquid nozzle 36 is not performed). However, even in the peripheral cleaning, the cleaning liquid may be discharged from the cleaning liquid nozzle 36 to the peripheral region R1. The cleaning liquid nozzle 36 is disposed so that it is capable of discharging the cleaning liquid to the peripheral region R1 as well. However, in order to suppress the increase of particles due to the splashing of the liquid from the wafer W as mentioned above, it is desirable that a second flow rate (mL/sec) of the cleaning liquid supplied to the cleaning liquid nozzle 36 during the peripheral cleaning is set to be smaller than a first flow rate (mL/sec) of the cleaning liquid supplied to the cleaning liquid nozzle 36 during the central cleaning. As described so far, the second flow rate may be 0 or may be a flow rate other than 0.

The opening degree of the valve 38 may be adjusted so that the flow rate of the cleaning liquid to the cleaning liquid nozzle 36 (that is, the flow rate discharged from the cleaning liquid nozzle 36) can be changed during the central cleaning and the peripheral cleaning as stated above. That is, the valve 38 may be configured as a flow rate adjusting mechanism. Further, a flow rate adjusting mechanism may be provided separately from the valve 38. When a plurality of cleaning liquid nozzles 36 are provided, a total flow rate of the cleaning liquid supplied to the respective cleaning liquid nozzles 36 in the peripheral cleaning is set to be smaller than the total flow rate of the cleaning liquid supplied to the respective cleaning liquid nozzles 36 in the central cleaning.

Furthermore, in the above description of the peripheral cleaning, the turning motion of the sliding body 51 by the rotary table 41 is not performed. However, this turning motion may be performed, and the sliding body 51 may reciprocate between a position on the center side of the wafer W and a position on the peripheral side thereof, thus being moved at the bottom surface of the wafer W. Moreover, although the sliding body 51 is not to be slid on the circumferential periphery of the wafer W in the above description, the sliding body 51 may be slid on the circumferential periphery as well.

In addition, a flow path is provided in, for example, the shaft 44 and the base plate 45 of the cleaning processing unit 4, and a downstream end of this flow path is opened to the sliding body 51. The cleaning liquid is supplied from the upstream side of the flow path, and the sliding body 51 is infiltrated by the supply of the cleaning liquid. Therefore, the cleaning liquid is not limited to being supplied to the sliding body 51 through the bottom surface of the wafer W and being absorbed by the sliding body 51 by being discharged from the cleaning liquid nozzle 36. As for the substrate, although it is particularly effective to clean a substrate on a bottom surface of which a hydrophobic film having the above-described contact angle is formed, the present exemplary embodiment is not limited to process the substrate having such a contact angle.

Additionally, instead of the configuration in which the sliding body 51 being rotated is moved left and right with respect to the wafer W during the central cleaning, the left and right positions of the sliding body 51 being rotated may be fixed, and the wafer W may be moved left and right instead, thus enabling the cleaning processing. To enable such movements, the moving mechanism 33 needs to be configured so that the cup 31 is movable left and right as well as being movable back and forth. Further, in the peripheral cleaning, instead of rotating the wafer W with respect to the sliding body 51 being rotated, a mechanism configured to rotate the cleaning processing unit 4 along the periphery of the wafer W may be provided, and the sliding body 51 may be moved along the circumferential direction of the wafer W. In other words, it is necessary to build a configuration in which either one of the wafer W and the sliding body 51 is moved relative to the other in the central cleaning and the peripheral cleaning. Further, the apparatus may be configured so that the forward/backward moving chuck 35 can be rotated while holding the wafer W in the central cleaning, and the relative movement between the sliding body 51 and the wafer W may be performed by the rotation of the wafer W as in the peripheral cleaning. Therefore, the cleaning in the central cleaning is not limited to being implemented by the turning operation of the sliding body 51.

Moreover, instead of the configuration in which the sliding body 51 is moved up and down and pressed against the wafer W by the elevating mechanism 42, the wafer W may be moved up and down and pressed against the sliding body 51. The moving mechanism 33 may be used in the central cleaning, and an elevating mechanism configured to move the spin chuck 13 and the rotating mechanism 15 up and down may be provided to move the wafer W up and down in the peripheral cleaning. That is, to press the wafer W and the sliding body 51 against each other, either the wafer W or the sliding body 51 may be moved up and down.

It should be noted that the above-described exemplary embodiments are illustrative in all aspects and are not anyway limiting. The above-described exemplary embodiments may be omitted, replaced and modified in various ways without departing from the scope and the spirit of claims.

According to the present disclosure, it is possible to provide the technique capable of suppressing the adhesion of the particle to the bottom surface of the substrate after being cleaned.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate cleaning apparatus, comprising:
   a holder configured to hold a substrate;
   a circular ring-shaped body when viewed from a top, which is an elastic body having open cells;
   grooves formed in a radial shape at an upper portion of the circular ring-shaped body to connect an inside and an outside of the circular ring-shaped body when viewed from the top, each groove having a bottom located on the circular ring-shaped body;
   a sliding surface which is a top surface of the circular ring-shaped body between the respective grooves, and configured to be slid on a bottom surface of the substrate;
   a supporting body configured to rotate the circular ring-shaped body in a circumferential direction and configured to support the circular ring-shaped body such that a sliding unit is not provided in a region surrounded by the circular ring-shaped body when viewed from the top, the sliding unit with respect to the substrate being divided in a rotational direction of the circular ring-shaped body and having a top surface higher than the sliding surface;

a cleaning liquid supply configured to allow a cleaning liquid to be absorbed into the circular ring-shaped body;

a relatively moving mechanism configured to move the substrate and the supporting body relative to each other in a transversal direction in a state that the sliding surface of the circular ring-shaped body being rotated and having absorbed the cleaning liquid presses the bottom surface of the substrate, so that the sliding surface and the bottom surface are slid relative to each other; and a controller configured to perform a substrate cleaning method comprising:

holding a peripheral region outside a central portion of the bottom surface of the substrate to perform a first cleaning by moving the circular ring-shaped body and the central portion of the bottom surface of the substrate relative to each other; and holding the central portion of the bottom surface of the substrate to perform a second cleaning by moving the circular ring-shaped body and the peripheral region relative to each other immediately after the first cleaning, and moving, by an elevating mechanism, the circular ring-shaped body up and down relative to the substrate such that a second height of the circular ring-shaped body crushed during the second cleaning is larger than a first height of the circular ring-shaped body crushed during the first cleaning.

2. The substrate cleaning apparatus of claim 1, wherein a depth of each groove is larger than a crushed height of the circular ring-shaped body when the sliding surface and the bottom surface of the substrate are slid relative to each other.

3. The substrate cleaning apparatus of claim 1, wherein the substrate is of a circular shape, and an outer diameter of the circular ring-shaped body is smaller than a radius of the substrate.

4. The substrate cleaning apparatus of claim 1, wherein the relatively moving mechanism comprises a substrate rotating mechanism configured to rotate the substrate held by the holder along with a rotation of the circular ring-shaped body such that a rotational speed of the circular ring-shaped body is larger than a rotational speed of the substrate in the second cleaning.

5. The substrate cleaning apparatus of claim 1, wherein the cleaning liquid supply comprises: a cleaning liquid nozzle configured to discharge the cleaning liquid to the bottom surface of the substrate; and a flow rate adjusting mechanism configured to set a flow rate of the cleaning liquid supplied to the cleaning liquid nozzle during the first cleaning as a first flow rate, and configured to set a flow rate of the cleaning liquid supplied to the cleaning liquid nozzle during the second cleaning as a second flow rate smaller than the first flow rate.

6. The substrate cleaning apparatus of claim 1, wherein the substrate cleaning apparatus further comprises a liquid droplet moving mechanism configured to move a liquid droplet of the cleaning liquid remaining at the central portion of the bottom surface of the substrate to the peripheral region before the holder holds the central portion of the bottom surface of the substrate after being subjected to the first cleaning.

7. The substrate cleaning apparatus of claim 1, wherein during the second cleaning, the elevating mechanism turns a state in which the second height is larger than the first height into a state in which the second height is smaller than the first height.

8. A substrate cleaning method of cleaning a bottom surface of a substrate by using a circular ring-shaped body when viewed from a top, wherein the circular ring-shaped body is an elastic body having open cells, the circular ring-shaped body is provided with grooves each of which has a bottom located on the circular ring-shaped body and is formed in a radial shape at an upper portion of the circular ring-shaped body to connect an inside and an outside of the circular ring-shaped body when viewed from the top, and a sliding surface which is a top surface of the circular ring-shaped body between the respective grooves and configured to be slid on the bottom surface of the substrate, and wherein the substrate cleaning method comprises:

rotating the circular ring-shaped body in a circumferential direction by rotating a supporting body configured to support the circular ring-shaped body such that a sliding unit with respect to the substrate, which is divided in a rotational direction of the circular ring-shaped body and has a top surface higher than the sliding surface, is not provided in a region surrounded by the circular ring-shaped body when viewed from the top;

holding the substrate by a holder;

allowing a cleaning liquid to be absorbed into the circular ring-shaped body by a cleaning liquid supply; and sliding, by a relatively moving mechanism, the sliding surface and the bottom surface relative to each other by moving the substrate and the circular ring-shaped body relative to each other in a transversal direction in a state that the sliding surface of the circular ring-shaped body being rotated and having absorbed the cleaning liquid presses the bottom surface of the substrate, wherein, in the sliding of the sliding surface and the bottom surface, a crushed height of the circular ring-shaped body is smaller than a depth of each groove, wherein the sliding of the sliding surface and the bottom surface comprises moving the circular ring-shaped body, which is provided eccentrically from a rotation center of a rotary table included in the relatively moving mechanism, relative to the substrate by rotating the circular ring-shaped body around the rotation center of the rotary table, wherein the holding of the substrate comprises:

holding a peripheral region outside a central portion of the bottom surface of the substrate to perform a first cleaning by moving the circular ring-shaped body and the central portion of the bottom surface of the substrate relative to each other; and holding the central portion of the bottom surface of the substrate to perform a second cleaning by moving the circular ring-shaped body and the peripheral region relative to each other immediately after the first cleaning, and the substrate cleaning method further comprises:

moving, by an elevating mechanism, the circular ring-shaped body up and down relative to the substrate such that a second height of the circular ring-shaped body crushed during the second cleaning is larger than a first height of the circular ring-shaped body crushed during the first cleaning.

9. The substrate cleaning method of claim 8,
wherein the substrate is of a circular shape, and an outer diameter of the circular ring-shaped body is smaller than a radius of the substrate.

10. The substrate cleaning method of claim 8,
wherein the holding of the substrate comprises:
wherein the sliding of the sliding surface and the bottom surface comprises rotating, by a substrate rotating mechanism included in the relatively moving mechanism, the substrate held by the holder along with a rotation of the circular ring-shaped body such that a rotational speed of the circular ring-shaped body is larger than a rotational speed of the substrate in the second cleaning.

11. The substrate cleaning method of claim 8,
the allowing of the cleaning liquid to be absorbed into the circular ring-shaped body comprises:
discharging the cleaning liquid to the bottom surface of the substrate from a cleaning liquid nozzle constituting the cleaning liquid supply; and
setting, by a flow rate adjusting mechanism constituting the cleaning liquid supply, a flow rate of the cleaning liquid supplied to the cleaning liquid nozzle during the first cleaning as a first flow rate, and setting a flow rate of the cleaning liquid supplied to the cleaning liquid nozzle during the second cleaning as a second flow rate smaller than the first flow rate.

12. The substrate cleaning method of claim 8,
wherein the holding of the substrate comprises:
the substrate cleaning method further comprises:
moving, by a liquid droplet moving mechanism, a liquid droplet of the cleaning liquid remaining at the central portion of the bottom surface of the substrate to the peripheral region before the holder holds the central portion of the bottom surface of the substrate after being subjected to the first cleaning.

13. The substrate cleaning method of claim 8,
wherein during the second cleaning, the elevating mechanism turns a state in which the second height is larger than the first height into a state in which the second height is smaller than the first height.

14. A substrate cleaning method of cleaning a bottom surface of a substrate by using a circular ring-shaped body when viewed from a top,
wherein the circular ring-shaped body is an elastic body having open cells,
the circular ring-shaped body is provided with grooves each of which has a bottom located on the circular ring-shaped body and is formed in a radial shape at an upper portion of the circular ring-shaped body to connect an inside and an outside of the circular ring-shaped body when viewed from the top, and a sliding surface which is a top surface of the circular ring-shaped body between the respective grooves and configured to be slid on the bottom surface of the substrate, and
wherein the substrate cleaning method comprises:
rotating the circular ring-shaped body in a circumferential direction by rotating a supporting body configured to support the circular ring-shaped body such that a sliding unit with respect to the substrate, which is divided in a rotational direction of the circular ring-shaped body and has a top surface higher than the sliding surface, is not provided in a region surrounded by the circular ring-shaped body when viewed from the top;
holding the substrate by a holder;
allowing a cleaning liquid to be absorbed into the circular ring-shaped body by a cleaning liquid supply; and
sliding, by a relatively moving mechanism, the sliding surface and the bottom surface relative to each other by moving the substrate and the circular ring-shaped body relative to each other in a transversal direction in a state that the sliding surface of the circular ring-shaped body being rotated and having absorbed the cleaning liquid presses the bottom surface of the substrate,
wherein, in the sliding of the sliding surface and the bottom surface, a crushed height of the circular ring-shaped body is smaller than a depth of each groove,
wherein the sliding of the sliding surface and the bottom surface comprises moving the circular ring-shaped body, which is provided eccentrically from a rotation center of a rotary table included in the relatively moving mechanism, relative to the substrate by rotating the circular ring-shaped body around the rotation center of the rotary table,
wherein the holding of the substrate comprises:
holding a peripheral region outside a central portion of the bottom surface of the substrate to perform a first cleaning by moving the circular ring-shaped body and the central portion of the bottom surface of the substrate relative to each other; and
holding the central portion of the bottom surface of the substrate to perform a second cleaning by moving the circular ring-shaped body and the peripheral region relative to each other immediately after the first cleaning, and
the substrate cleaning method further comprises:
moving, by an elevating mechanism, the circular ring-shaped body up and down relative to the substrate such that a first height of the circular ring-shaped body crushed during the first cleaning is larger than a second height of the circular ring-shaped body crushed during the second cleaning.

\* \* \* \* \*